(12) United States Patent
Kim et al.

(10) Patent No.: US 10,134,740 B2
(45) Date of Patent: Nov. 20, 2018

(54) SEMICONDUCTOR DEVICE AND METHOD FOR FABRICATING THE SAME

(71) Applicant: SAMSUNG ELECTRONICS CO., LTD., Suwon-si, Gyeonggi-do (KR)

(72) Inventors: Dong Wan Kim, Hwaseong-si (KR); Ji Hun Kim, Hwaseong-si (KR); Jae Joon Song, Suwon-si (KR); Hiroshi Takeda, Seongnam-si (KR); Jung Hoon Han, Hwaseong-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/644,877

(22) Filed: Jul. 10, 2017

(65) Prior Publication Data

US 2018/0145080 A1 May 24, 2018

(30) Foreign Application Priority Data

Nov. 18, 2016 (KR) .................. 10-2016-0153726

(51) Int. Cl.
| | |
|---|---|
| *H01L 27/108* | (2006.01) |
| *H01L 29/423* | (2006.01) |
| *H01L 29/49* | (2006.01) |
| *H01L 29/06* | (2006.01) |
| *H01L 23/528* | (2006.01) |
| *H01L 21/28* | (2006.01) |
| *H01L 21/02* | (2006.01) |

(52) U.S. Cl.
CPC .. *H01L 27/10823* (2013.01); *H01L 21/28088* (2013.01); *H01L 23/528* (2013.01); *H01L 27/10814* (2013.01); *H01L 27/10876* (2013.01); *H01L 29/0649* (2013.01); *H01L 29/4236* (2013.01); *H01L 29/4966* (2013.01); *H01L 29/4991* (2013.01); *H01L 21/0217* (2013.01); *H01L 21/02164* (2013.01)

(58) Field of Classification Search
CPC ......... H01L 21/28088; H01L 21/02164; H01L 21/0217; H01L 23/528; H01L 29/0649; H01L 29/4236; H01L 29/4966; H01L 29/4991
USPC ................................. 257/334, 392
See application file for complete search history.

(56) References Cited

U.S. PATENT DOCUMENTS

| | | |
|---|---|---|
| 7,525,133 B2 | 4/2009 | Ohta et al. |
| 7,671,394 B2 | 3/2010 | Booth, Jr. et al. |
| 9,178,026 B2 | 11/2015 | Seo |
| 9,240,414 B1 | 1/2016 | Kim et al. |
| 9,368,589 B2 | 6/2016 | Baek et al. |
| 2012/0119278 A1 | 5/2012 | Mikasa |

(Continued)

FOREIGN PATENT DOCUMENTS

| | | |
|---|---|---|
| JP | 2014-135311 A | 7/2014 |
| KR | 10-1131953 B1 | 3/2012 |

*Primary Examiner* — Cuong Q Nguyen
*Assistant Examiner* — Tong-Ho Kim
(74) *Attorney, Agent, or Firm* — Lee & Morse, P.C.

(57) ABSTRACT

A semiconductor device including a substrate; a trench formed within the substrate; a gate insulating film formed conformally along a portion of a surface of the trench; a gate electrode formed on the gate insulating film and filling a portion of the trench; a capping film formed on the gate electrode and filling the trench; and an air gap formed between the capping film and the gate insulating film.

19 Claims, 14 Drawing Sheets

(56) References Cited

U.S. PATENT DOCUMENTS

| | | | |
|---|---|---|---|
| 2012/0235228 A1* | 9/2012 | Huang | H01L 29/4236 257/330 |
| 2014/0061742 A1 | 3/2014 | Nishitani et al. | |
| 2014/0087535 A1* | 3/2014 | Roh | H01L 21/823412 438/285 |
| 2015/0021742 A1 | 1/2015 | Van Brunt et al. | |
| 2015/0214220 A1* | 7/2015 | Seo | H01L 27/088 257/392 |
| 2015/0221742 A1* | 8/2015 | Yi | H01L 29/4236 257/295 |
| 2016/0035731 A1 | 2/2016 | Lee et al. | |

* cited by examiner

SEMICONDUCTOR DEVICE AND METHOD FOR FABRICATING THE SAME

CROSS-REFERENCE TO RELATED APPLICATION

Korean Patent Application No. 10-2016-0153726, filed on Nov. 18, 2016, in the Korean Intellectual Property Office, and entitled: "Semiconductor Device and Method for Fabricating the Same," is incorporated by reference herein in its entirety.

BACKGROUND

1. Field

Embodiments relate to a semiconductor device and a method for fabricating the same.

2. Description of the Related Art

A buried channel array transistor (BCAT) may include gate electrodes buried in trenches, and thus may overcome a short channel effect associated with a DRAM structure.

SUMMARY

The embodiments may be realized by providing a semiconductor device including a substrate; a trench formed within the substrate; a gate insulating film formed conformally along a portion of a surface of the trench; a gate electrode formed on the gate insulating film and filling a portion of the trench; a capping film formed on the gate electrode and filling the trench; and an air gap formed between the capping film and the gate insulating film.

The embodiments may be realized by providing a semiconductor device including a trench formed within a substrate; a gate insulating film formed conformally along a portion of a sidewall of the trench, wherein a height of an upper surface of the gate insulating film is a first height; a gate electrode formed on the gate insulating film, wherein a height of an upper surface of the gate electrode is a second height higher than the first height; a capping film formed on the gate electrode and entirely filling the trench; and an air gap formed under the capping film, between the gate electrode and a sidewall of the trench and between the first height and the second height.

The embodiments may be realized by providing a semiconductor device including a substrate; a trench in the substrate; a gate insulating film conformally formed along a bottom portion of the trench; a gate electrode on the gate insulating film; a capping film on the gate electrode, the capping film extending from the gate electrode to an opening of the trench; and an air gap defined by the capping film, the gate insulating film, the gate electrode, and a sidewall of the trench.

BRIEF DESCRIPTION OF THE DRAWINGS

Features will be apparent to those of skill in the art by describing in detail exemplary embodiments with reference to the attached drawings in which.

DETAILED DESCRIPTION

Hereinafter, a semiconductor device according to some exemplary embodiments will be described with reference to FIGS. 1 to 4.

Figure 1:
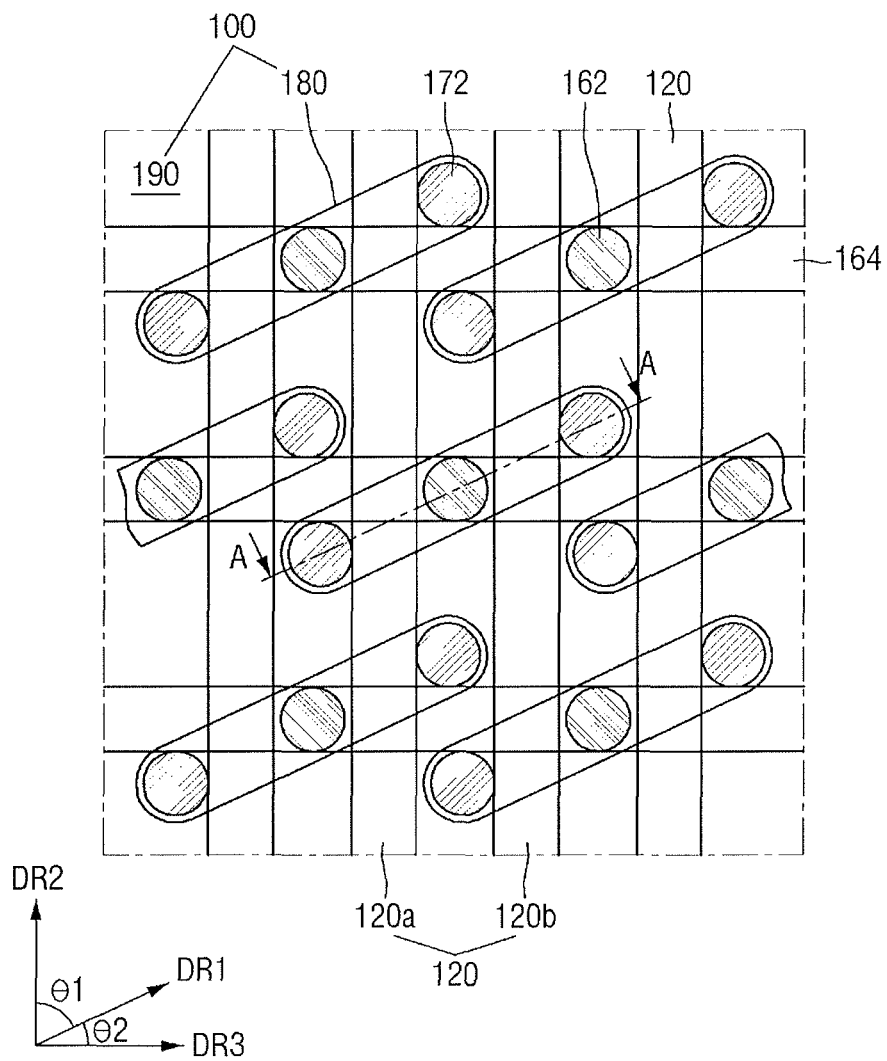
FIG. 1 illustrates a layout view of a semiconductor device according to some exemplary embodiments.
Figure 2:
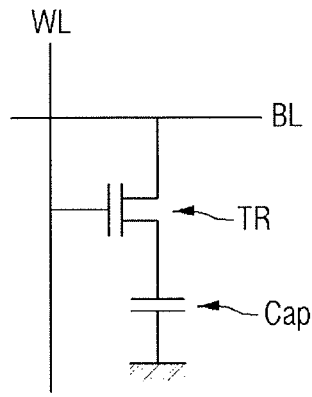
FIG. 2 illustrates a circuit view of the semiconductor device of FIG. 1.
Figure 3:
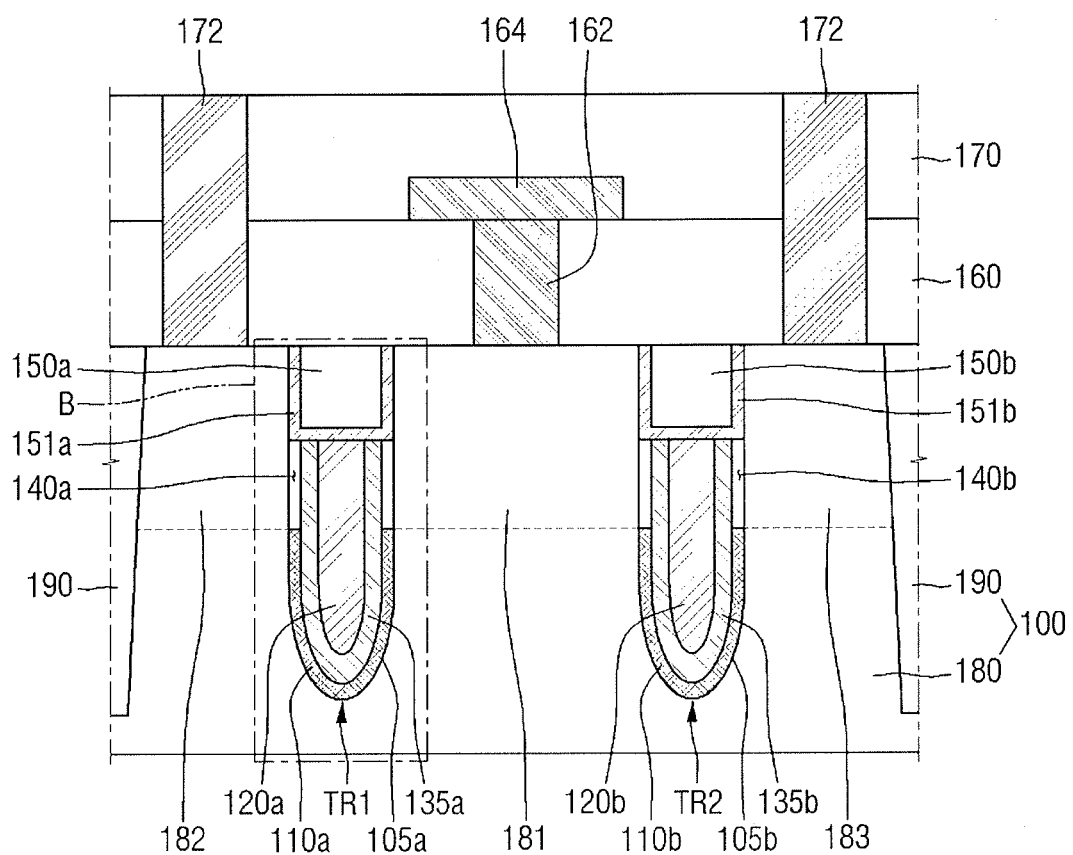
FIG. 3 illustrates a cross sectional view taken along line A-A of FIG. 1.
Figure 4:
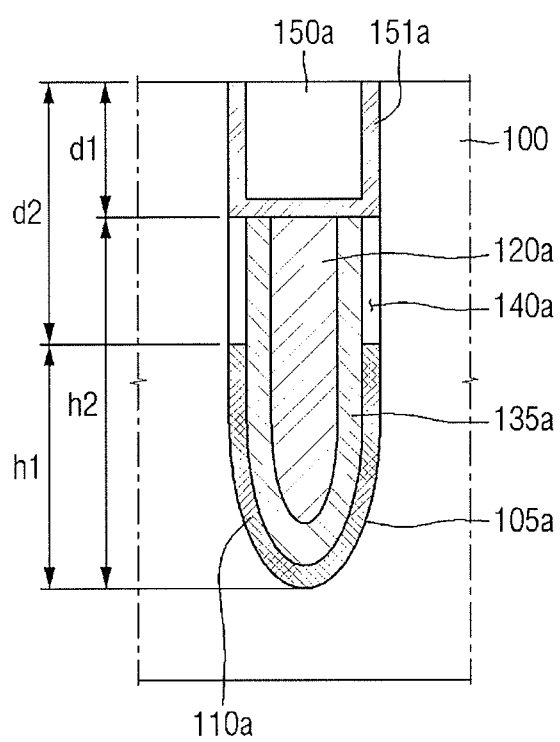
FIG. 4 illustrates an enlarged cross sectional view of the encircled section B of FIG. 3.

FIG. 1 illustrates a layout view of a semiconductor device according to some exemplary embodiments, and FIG. 2 illustrates a circuit view of the semiconductor device of FIG. 1. FIG. 3 illustrates a cross sectional view taken along line A-A of FIG. 1 and FIG. 4 illustrates an enlarged cross sectional view of the encircled section B of FIG. 3.

Referring to FIG. 1, the semiconductor device according to some exemplary embodiments may include, e.g., a substrate 100, a word line 120, a bit line 164, a storage node contact 172, and a bit line contact 162.

The substrate 100 may be, e.g., a bulk silicon or a silicon-on-insulator (SOI). In an implementation, the substrate 100 may include a material different from pure silicon, e.g., silicon germanium, indium antimonide, lead telluride compound, indium arsenide, indium phosphide, gallium arsenide, or gallium antimonide. In an implementation, the substrate 100 may be a base substrate having an epitaxial layer formed thereon.

The substrate 100 may include an active region 180 and a device isolation film 190. The active region 180 may be defined with or by the device isolation film 190. In an implementation, the active region 180 may be provided in plural, and the active regions 180 may be spaced from each other with the device isolation film 190.

The active region 180 may extend (e.g., lengthwise) in a first direction DR1, the word line 120 may extend in a second direction DR2 (e.g., at an acute angle to the first direction DR1), and the bit line 164 may extend in a third direction DR3 (e.g., at an acute angle to the first direction DR1).

As used herein, the "angle" in the statement that reads, e.g., a certain direction is at a predetermined angle with a certain different direction, refers to a smaller angle when two angles are formed between two directions intersecting each other (e.g., of complementary angles). For example, the "angle" refers to 60°, when 120° and 60° are the angles that can be made between two intersecting directions. Accordingly, as illustrated in FIG. 1, an angle between the first direction DR1 and the second direction DR2 is θ1, and an angle between the first direction DR1 and the third direction DR3 is θ2.

θ1 and/or θ2 may form an acute angle to help increase integration density of a memory cell. For example, while reducing a size of the active region 180, it may help ensure a desired pitch between the bit line 164, the active region 180, and a storage node contact 172 connecting a capacitor. In an implementation, θ1 and θ2 may each be, e.g., 45° and 45°, or 30° and 60°, or 60° and 30°.

Referring to FIGS. 1 and 3, the semiconductor device according to some exemplary embodiments may be a form of the memory cell. In an implementation, as illustrated in FIG. 2, a dynamic random access memory (DRAM) cell may be but one example of the memory cell.

At a point of intersection between the word line (WL) 120 and the bit line (BL) 164, the memory cell (storing data) may be disposed. The memory cell may include the cell capacitor (Cap), and a transistor (TR) connected between the bit line (BL) 164 and the cell capacitor.

A gate of the transistor (TR) may be electrically connected with the word line (WL) 120. Source/drains 181-183 of the transistor (TR) may be connected with one end of the bit line (BL) 164/the cell capacitor (Cap).

For example, the first source/drain 181 may be connected through the bit line (BL) 164 and the bit line contact 162, and the second source/drains 182, 183 may be connected through the cell capacitor (Cap) and the storage node contact 172.

The other end of the cell capacitor (Cap) may be connected with a ground voltage. The transistor (TR) may be substantially same as the semiconductor device which will be described with reference to FIGS. 1 to 4. In an implementation, the transistor (TR) may be an N-type transistor.

Referring to FIGS. 3 and 4, the two transistors (TR1, TR2) may be formed within one active region 180.

The first transistor (TR1) may include, e.g., a first trench 105a, a first gate insulating film 110a, a first gate electrode 120a, 135a, a first capping film 150a, 151a and a first air gap 140a.

The first trench 105a may be formed within the substrate 100. The first trench 105a may have several shapes. In an implementation, as illustrated, the first trench 105a may have a shape in which a connection portion between a bottom surface and a sidewall is round. In an implementation, the first trench 105a may have a shape in which a sidewall is inclined at a predetermined angle.

The first gate insulating film 110a may be formed conformally within the first trench 105a. The first gate insulating film 110a may be formed along a sidewall and a bottom surface of the first trench 105a. In an implementation, the first gate insulating film 110a may partially expose a sidewall and/or the bottom surface of the first trench 105a. For example, the first gate insulating film 110a may be formed on the bottom surface of the first trench 105a to a first height h1 (e.g., as measured from the bottom of the trench). For example, this may be from a surface of the substrate 100 to a first depth d1.

The first gate insulating film 110a may include, e.g., a silicon oxide film, a silicon nitride film, a silicon oxynitride film, or a high-k dielectric material. In an implementation, the high-k dielectric material may include, e.g., $HfO_2$, $HfSiO_4$, HfAlO, $ZrO_2$, $ZrSiO_4$, $TaO_2$, $Ta_2O_5$, or $Al_2O_3$. In an implementation, the first gate insulating film 110a may not be formed on an upper surface of the substrate 100.

The first gate electrode 120a, 135a may be formed on the first gate insulating film 110a.

The first gate electrode 120a, 135a may be formed within the first trench 105a to bury a portion of the first trench 105a, e.g., without entirely filling the first trench 105a. In an implementation, the first gate electrode 120a, 135a may be formed to a second height h2 higher than the first gate insulating film 110a (e.g., as measured from the bottom of the trench).

For example, a height of an upper surface (e.g., surface distal to the bottom of the trench) of the first gate electrode 120a, 135a may be different from a height of an upper surface of the first gate insulating film 110a. In an implementation, the height of the upper surface of the first gate electrode 120a, 135a may be higher than that of the upper surface of the first gate insulating film 110a. For example, the upper surface of the first gate electrode 120a, 135a may be formed by or at the first depth d1 from the upper surface of the substrate 100, and the upper surface of the first gate insulating film 110a may be formed by or at a second depth d2 that is deeper or greater than the first depth d1.

The first gate electrode 120a, 135a may include, e.g., a first filling film 120a and a first barrier film 135a.

In an implementation, the first filling film 120a may include a conductive material, e.g., a metal such as tungsten W.

The first barrier film 135a may have a shape such that the first barrier film 135a surrounds a lower portion of the first filling film 120a (e.g., a bottom surface and a lower sidewall of the first filling film 120a proximate to the bottom of the trench). An upper surface of the first barrier film 135a may be lower (e.g., closer to the bottom of the trench) than the upper surface of the substrate 100, and may be in a same plane as an upper surface of the first filling film 120a (e.g., the upper surface of the first filling film 120a may be coplanar with the upper surface of the first barrier film 135a).

In an implementation, the first barrier film 135a may include a conductive material, e.g., a metal such as titanium nitride (TiN).

The first barrier film 135a may be directly in contact with the first gate insulating film 110a, and may help improve formation and resistance characteristics of the first filling film 120a. Further, the first barrier film 135a may help perform work function adjustment in the first gate electrode 120a, 135a.

The first air gap 140a may be between the upper portion of the first gate electrode 120a, 135a (e.g., distal to the bottom of the trench) and a sidewall of the first trench 105a. For example, the first air gap 140a may be between an upper portion of the first barrier film 135a and the sidewall of the first trench 105a.

In an implementation, the first air gap 140a may be on both sides of the first gate electrode 120a, 135a. The first air gap 140a may be between the first gate insulating film 110a and the first capping film 150a, 151a which will be described below. For example, the first air gap 140a may be surrounded with or bounded by the first barrier film 135a, the sidewall of the first trench 105a, the first gate insulating film 110a and the first capping film 150a, 151a.

For example, the upper surface, upper end, or upper opening of the first air gap 140a (e.g., distal to the bottom of the trench) may be disposed on a plane same as the upper surface of the first gate electrode 120a, 135a. The first air gap 140a may have a height (e.g., as measured from the first gate insulating film 110a) corresponding or equal to difference between the first depth d1 and the second depth d2 or difference between the first height h1 and the second height h2.

The first capping film 150a, 151a may bury or close off the first trench 105a in or on the first filling film 120a. The first capping film 150a, 151a may be formed on the first air gap 140a and the first gate electrode 120a, 135a.

The first capping film 150a, 151a may include a first line capping film 151a and a first filling capping film 150a. The first line capping film 151a may be formed conformally on the first gate electrode 120a, 135a and an upper surface of the first air gap 140a. The first line capping film 151a may also be formed conformally also on the sidewall of the first trench 105a.

The first filling capping film 150a may be formed to entirely fill (e.g., remaining portions of) the first trench 105a on the first line capping film 151a (e.g., may fill portions of the first trench 105a not occupied by the first gate insulating film 110a, the first gate electrode 120a, 135a, and the first air gap 140a). A bottom surface (e.g., proximate to or facing the bottom of the trench) and a side surface of the first filling capping film 150a may be on the first line capping film 151a.

In an implementation, the first capping film 150a, 151a may include, e.g., a nitride film, an oxynitride film, or the like. In an example, the first capping film 150a, 151a will be described by exemplifying the nitride film.

Similarly, the second transistor (TR2) may include a second trench 105b, a second gate insulating film 110b, a second gate electrode 120b, 135b, a second capping film 150b, and a second air gap 140b.

Referring to FIG. 3, the second transistor (TR2) may be formed in a shape or configuration that is the same as the first transistor (TR1) described above.

The first source/drain 181 and the second source/drain 182, 183 may be within the substrate 100 at sides, e.g., both sides, of the first trench 105a and the second trench 105b. In an implementation, the first source/drain 181 may be between the first trench 105a and the second trench 105b, and the second source/drain 182, 183 may be each positioned on an opposite direction to or side of the first source/drain 181 with respect to the first trench 105a and the second trench 105b.

The first source/drain 181 may be electrically connected with the bit line 164, and the second source/drain 182, 183 may be electrically connected with the storage node and the capacitor.

A depth of a lower surface formed by the first source/drain 181 and the second source/drain 182, 183 may be same as a depth of a lower surface, lower end, or lower opening (e.g., proximate to the bottom of the trench) of the first air gap 140a and the second air gap 140b. The semiconductor device according to some exemplary embodiments may thereby help reduce leakage current by greatly reducing the electric field of the first gate electrode 120a, 135a and the second gate electrode 120b, 135b.

For example, between gate-drain regions of the buried gates, e.g., the first gate electrode 120a, 135a and the second gate electrode 120b, 135b, a strong electric field may be generated. With such strong electric field, gate induced drain leakage (GIDL) phenomenon could occur.

In the semiconductor device according to some exemplary embodiments, when the first air gap 140a and the second air gap 140b are each disposed between the first gate electrode 120a, 135a and the second gate electrode 120b, 135b, and the sidewalls of the first trench 105a and the second trench 105b, a dielectric constant between the gate-drain region may be reduced such that the electric field may be reduced, thereby reducing leakage current.

Simultaneously, the first air gap 140a and the second air gap 140b may greatly help reduce compressive stress according to a difference of a thermal expansion coefficient between a capping material which may be formed on the air gap and the silicon substrate.

When the semiconductor device according to some exemplary embodiments is a first conductivity type (e.g., N-type) transistor, mobility of a carrier (e.g., electron) of the semiconductor device may increase as compressive stress is reduced, and thus an amount of the electric current may increase.

Hereinbelow, a semiconductor device according to some exemplary embodiment will be explained with reference to FIG. 5. For convenience of explanation, differences that are not explained above may be mainly explained below.

Figure 5:
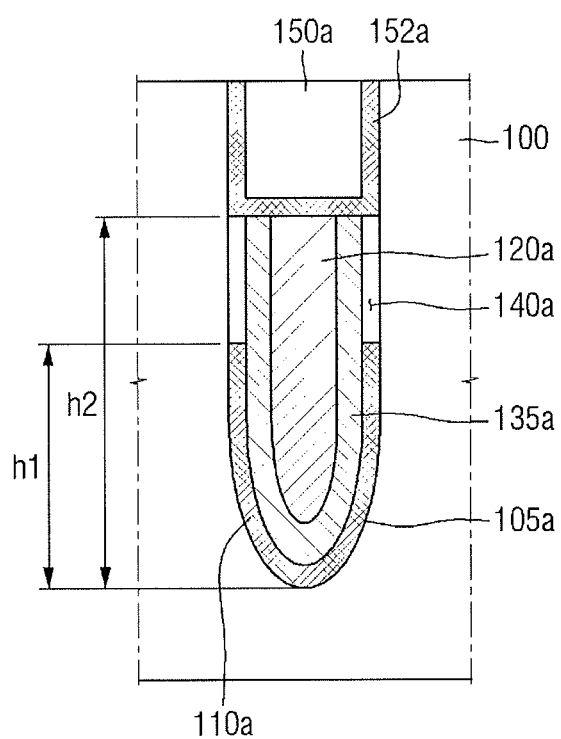
FIG. 5 illustrates a cross sectional view of a semiconductor device according to some exemplary embodiments.

FIG. 5 illustrates a cross sectional view of a semiconductor device according to some exemplary embodiments. FIG. 5 is an enlarged view of a section corresponding to B of FIG. 3, and the first transistor (TR1) will be described below and the other part may not be described for convenience. It is assumed that the second transistor (TR2) is formed in the same manner as the first transistor (TR1).

Referring to FIG. 5, the first line capping film 152a of the semiconductor device according to some exemplary embodiments may be a same material as the first gate insulating film 110a. In an implementation, both of the first gate insulating film 110a and the first line capping film 152a may include a silicon oxide film.

As the first line capping film 152a and the first gate insulating film 110a are formed with a same material, a forming process of the first air gap 140a may be more stable. For example, shapes and sizes of a plurality of the air gaps formed within the semiconductor device according to some exemplary embodiments may be more uniform with each other.

Further, the first line capping film 152a and the first gate insulating film 110a, which are in contact with the first gate electrodes 120a, 135a, and have a characteristic of applying the same stress on the first gate electrode 120a, 135a, may help efficiently enhance mobility of the carrier of the first gate electrodes 120a, 135a.

The first filling capping film 150a on the first line capping film 152a may include different materials from the first line capping film 152a. In an implementation, the first filling capping film 150a may include, e.g., a silicon nitride film.

The first line capping film 152a may include different materials from the first filling capping film 150a, and the first air gap 140a may be formed more easily. For example, the first line capping film 152a may be first formed with a method with poor step coverage, and then, the first filling capping film 150a may entirely fill the remaining portions of the first trench 105a.

Hereinbelow, a semiconductor device according to some exemplary embodiment will be explained with reference to FIG. 6. For convenience of explanation, differences that are not explained above may be mainly explained below.

Figure 6:
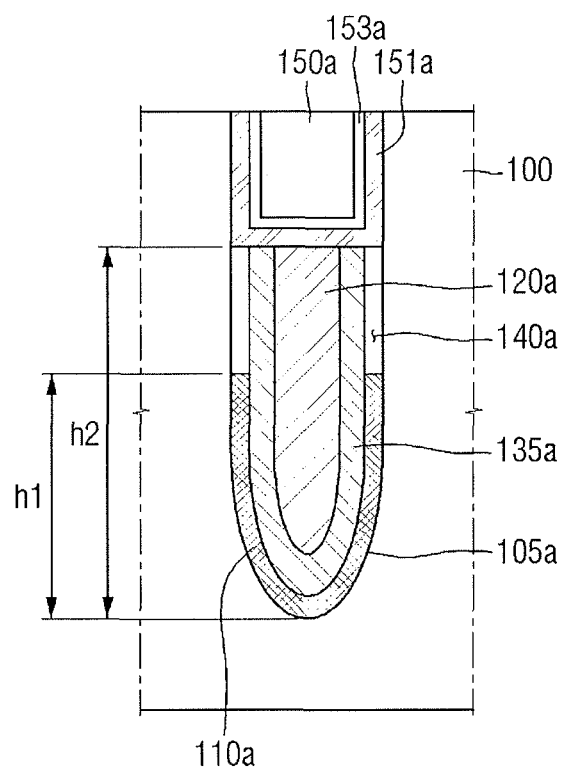
FIG. 6 illustrates a cross sectional view of a semiconductor device according to some exemplary embodiments.

FIG. 6 illustrates a cross sectional view of a semiconductor device according to some exemplary embodiments. FIG. 6 is an enlarged view of a section corresponding to B of FIG. 3, the first transistor (TR1) will be described below, and the other parts may not be described for convenience. It is assumed that the second transistor (TR2) is formed in the same manner as the first transistor (TR1).

Referring to FIG. 6, the semiconductor device according to some exemplary embodiments may additionally include a native oxide film 153a.

The native oxide film 153a may be formed conformally between the first line capping film 151a and the first filling capping film 150a. In an implementation, the native oxide film 153a may be formed as the first line capping film 151a is oxidized naturally in the air. In an implementation, the native oxide film 153a may be formed by being deposited on the first line capping film 151a.

The native oxide film 153a may be a very thin film compared to the first line capping film 151a. In an implementation, the native oxide film 153a may be, e.g., a silicon oxide film or a silicon oxynitride film.

Hereinbelow, a semiconductor device according to some exemplary embodiment will be explained with reference to FIG. 7. For convenience of explanation, differences that are not explained above will be mainly explained below.

Figure 7:
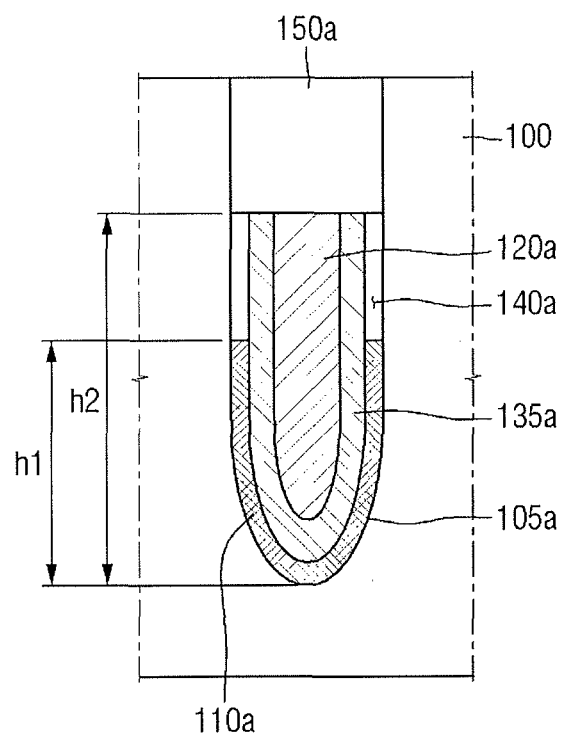
FIG. 7 illustrates a cross sectional view of a semiconductor device according to some exemplary embodiments.

FIG. 7 illustrates a cross sectional view of a semiconductor device according to some exemplary embodiments. FIG. 7 is an enlarged view of a section corresponding to B of FIG. 3, the first transistor (TR1) will be described below, and the other parts may not be described for convenience. It is assumed that the second transistor (TR2) is formed in the same manner as the first transistor (TR1).

Referring to FIG. 7, the semiconductor device according to some exemplary embodiments may include, e.g., a first capping film having a single structure (e.g., may include only the first filling capping film 150a).

The first capping film may be a single-layered film instead of a double-layered film. For example, the first capping films, as one film, may entirely fill the first trench 105a (e.g., the portions of the first trench 105a not occupied by the first gate insulating film 110a, the first gate electrode 120a, 135a, and the first air gap 140a). The first capping film may be formed on the first air gap 140a and the upper surface of the first gate electrode 120a, 135a.

An upper surface of the first capping film may be in same plane as the upper surface of the substrate 100 (e.g., may be coplanar with the upper surface of the substrate). In an implementation, the first capping film may include, e.g., silicon nitride, silicon oxide, or silicon oxynitride.

Hereinbelow, a semiconductor device according to some exemplary embodiment will be explained with reference to FIG. 8. For convenience of explanation, differences that are not explained above will be mainly explained below.

Figure 8:
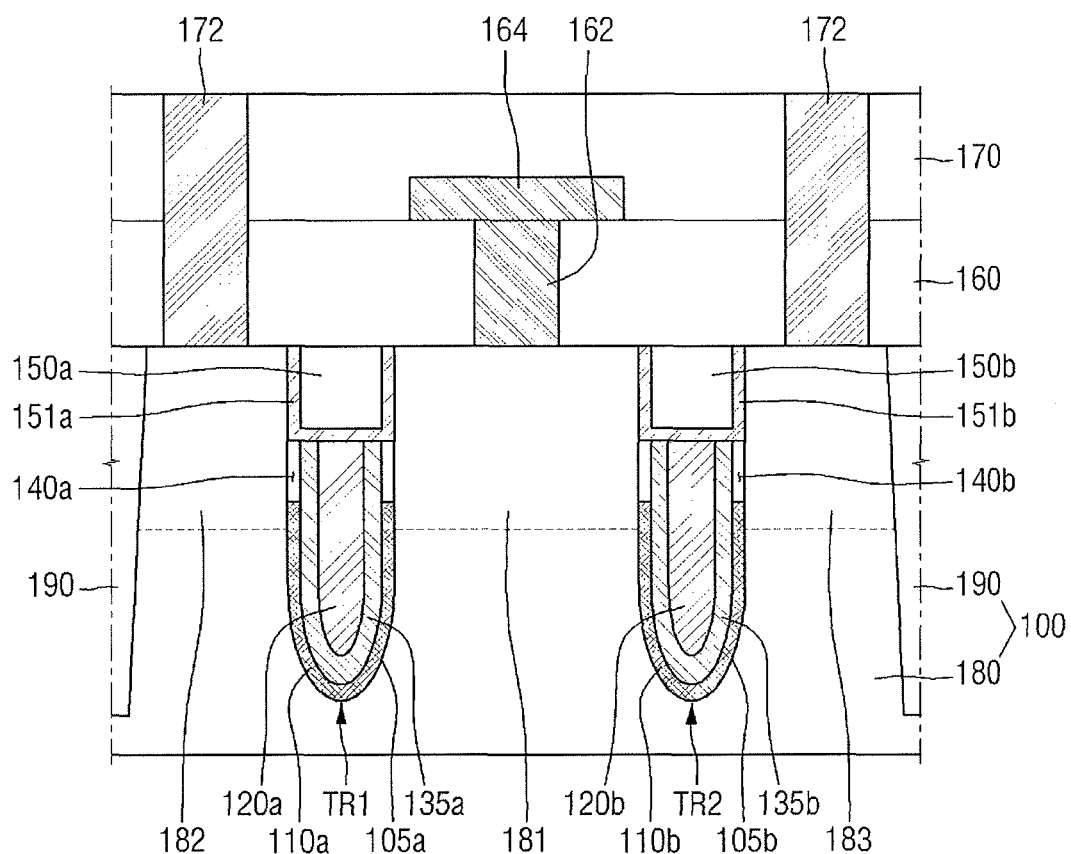
FIG. 8 illustrates a cross sectional view of a semiconductor device according to some exemplary embodiments.

FIG. 8 illustrates a cross sectional view of a semiconductor device according to some exemplary embodiments.

Referring to FIG. 8, in the semiconductor device according to some exemplary embodiments, upper surfaces of the first gate insulating film 110a and the second gate insulating film 110b may be higher than (e.g., farther from the bottom of the trench than) lower surfaces of the first source/drain 181 and the second source/drain 182, 183.

For example, as the first air gap 140a and the second air gap 140b are formed, GIDL effects may be reduced. When exposure of the side surface of each of the first gate electrode 120a, 135a and the second gate electrode 120b, 135b increases due to the first air gap 140a and the second air gap 140b, resistance of the first air gap 140a and the second air gap 140b may be relatively higher than that of the first gate insulating film 110a and the second gate insulating film 110b. Thus, leakage current at the first gate electrode 120a, 135a and the second gate electrode 120b, 135b toward the first gate insulating film 110a and the second gate insulating film 110b could also become higher.

Accordingly, in order for such leakage current to be kept low, the lower surface, lower end, or lower opening of the first air gap 140a and the second air gap 140b, i.e., the upper surface of the first gate insulating film 110a and the second gate insulating film 110b may be higher than the lower surface of the first source/drain 181 and the second source/drain 182, 183.

Hereinbelow, a semiconductor device according to some exemplary embodiment will be explained with reference to FIG. 9. For convenience of explanation, differences that are not explained above will be mainly explained below.

Figure 9:
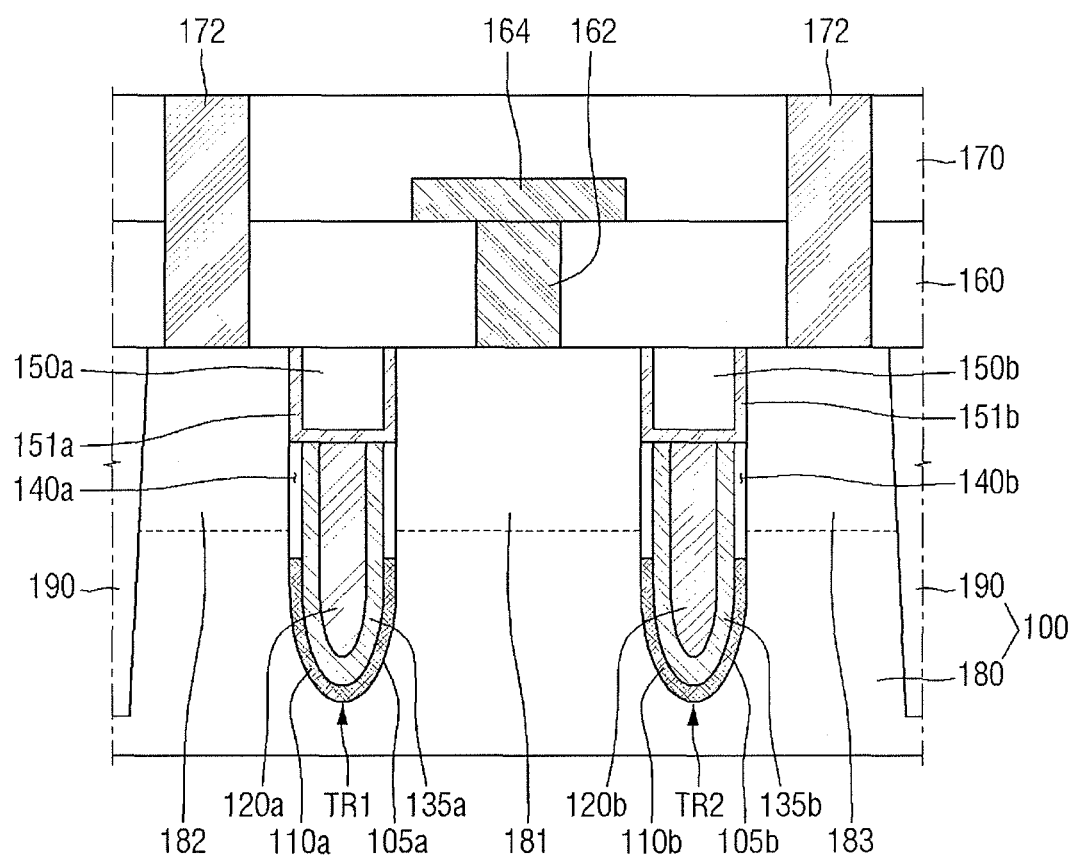
FIG. 9 illustrates a cross sectional view of a semiconductor device according to some exemplary embodiments.

FIG. 9 illustrates a cross sectional view of a semiconductor device according to some exemplary embodiments.

Referring to FIG. 9, the upper surfaces of the first gate insulating film 110a and the second gate insulating film 110b in the semiconductor device according to some exemplary embodiments may be lower than (e.g., closer to the bottom of the trench than) the lower surfaces of the first source/drain 181 and the second source/drain 182, 183.

For example, as the first air gap 140a and the second air gap 140b are formed, GIDL effects may be reduced. When exposure of the side surface of each of the first gate electrode 120a, 135a and the second gate electrode 120b, 135b increases by the first air gap 140a and the second air gap 140b, a dielectric constant between the first gate electrode 120a, 135a and the second gate electrode 120b, 135b and the storage node may be lowered and parasitic capacitance thereof becomes further lowered, and it may reduce GIDL effects.

Accordingly, in order to help maximize such reduction of GIDL effects, the lower surface of the first air gap 140a and the second 140b, i.e., the upper surfaces of the first gate insulating film 110a and the second gate insulating film 110b may be formed to be lower than the lower surfaces of the first source/drain 181 and the second source/drain 182, 183.

Referring to FIGS. 8 and 9, reduction of GIDL effects and reduction of leakage current according to resistance may be properly set by adjusting a ratio of the air gap and the gate insulating film (e.g., a relative position of an upper surface or upper end of the gate insulating film. For example, when reduction of GIDL effects is further required, a surface area or overall size of the air gap may be increased, and a surface area or size of the gate insulating film may be reduced to help enhance operating performance.

Conversely, in a device in which leakage current according to resistance is more sensitive, a size of the air gap may be minimized or reduced and a size of the gate insulating film may be increased to help reduce leakage current according to resistance.

For example, the semiconductor device according to some exemplary embodiments may properly adjust a surface area ratio or relative size of the air gap formation by considering the effects described above.

Hereinbelow, a semiconductor device according to some exemplary embodiments will be described with reference to FIGS. 10 to 17. For convenience of explanation, differences that are not explained above will be mainly explained below.

FIGS. 10 to 17 Illustrate views of stages in a method for fabricating a semiconductor device according to some exemplary embodiments. FIGS. 10 to 17 are enlarged views of a section corresponding to B of FIG. 3. The first transistor (TR1) will be described below, and the other part may not be described for convenience. It is assumed that the second transistor (TR2) is formed in the same manner as the first transistor (TR1).

Figure 10:
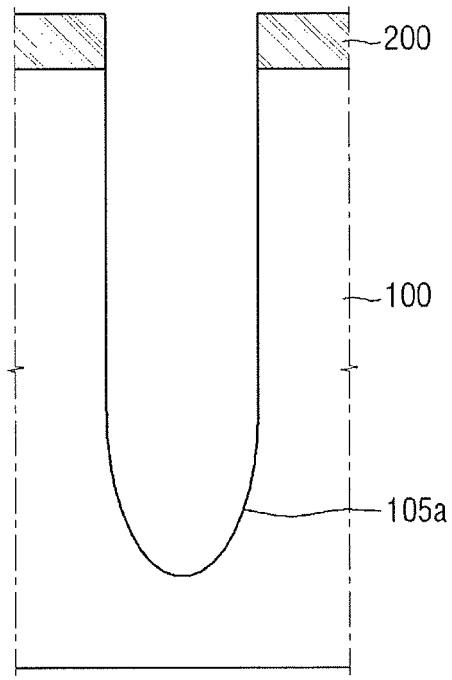
FIGS. 10 to 17 illustrate views of stages in a method for fabricating a semiconductor device according to some exemplary embodiments.

Referring to FIG. 10, the first trench 105a may be formed within the substrate 100.

For example, a mask pattern 200 may be formed on the substrate 100 by using a photolithography process. The mask pattern 200 may expose a region of substrate 100 where the first trench 105a is to be formed.

The mask pattern 200 may be, e.g., an oxide film, a nitride film, an oxynitride film, or the like. The region of the substrate 100 to be exposed with the mask pattern may be dry-etched to form the first trench 105a.

In an implementation, an impurity region for the source/drain may be formed within the substrate 100 before the mask pattern 200 is formed.

Figure 11:
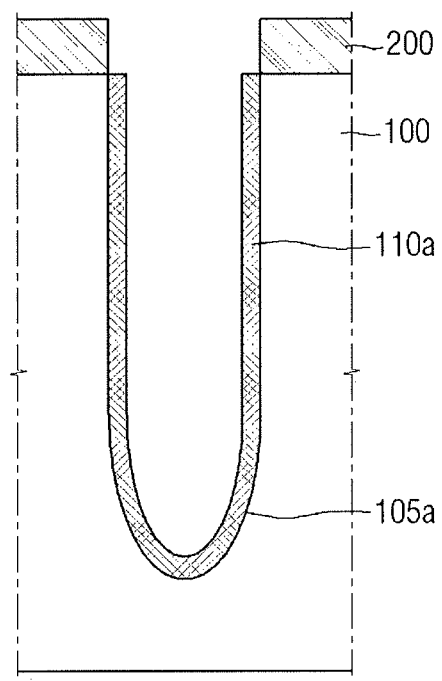

Next, referring to FIG. 11, on the substrate 100 having the first trench 105a, the first gate insulating film 110a may be conformally formed. The first gate insulating film 110a may be formed along the bottom surface and the sidewall of the first trench 105a. In an implementation, the first gate insulating film 110a may be conformally formed also on a side surface and an upper surface of the mask pattern 200 (e.g., and portions of the first gate insulating film 110a outside of the trench may be removed).

For example, the first gate insulating film 110a may be formed by chemical vapor deposition (CVD) or the atomic layer deposition (ALD).

The first gate insulating film 110a may be formed of, e.g., a silicon oxide film, a silicon nitride film, a silicon oxynitride film, or a high-k dielectric material. For example, the high-k dielectric material may include $HfO_2$, $HfSiO_4$, HfAlO, $ZrO_2$, $ZrSiO_4$, $TaO_2$, $Ta_2O_5$, or $Al_2O_3$.

Figure 12:
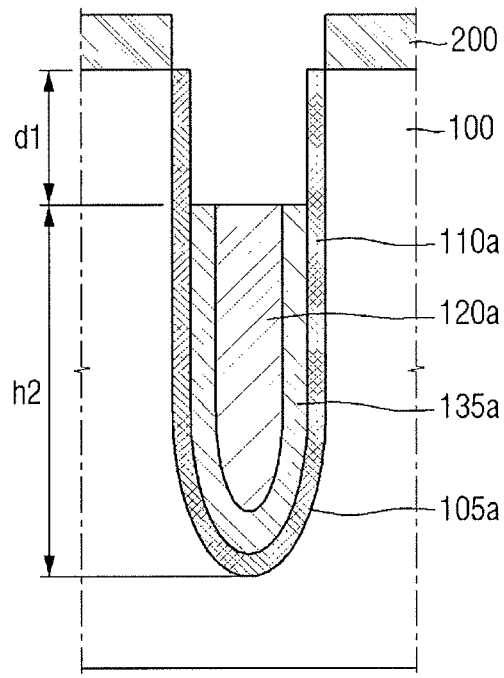

Next, referring to FIG. 12, the first gate electrode 120a, 135a burying or filling a portion of the first trench 105a may be formed on the first gate insulating film 110a. The first gate electrode 120a, 135a may include the first filling film 120a and the first barrier film 135a surrounding a sidewall and a bottom surface of the first filling film 120a.

For example, the first barrier film 135a and the first filling film 120a may be formed sequentially to entirely fill the first trench 105a on the first gate insulating film 110a, and then, a portion of the first gate electrode 120a, 135a may be removed by using an etch back process.

Accordingly, the upper surface of the first gate electrode 120a, 135a may be recessed to the first depth d1 from the upper or outer surface of the substrate 100. In an implementation, the first filling film 120a may include a conductive material, e.g., a metal such as tungsten W.

The first barrier film 135a may be between the first filling film 120a and the first gate insulating film 110a. The upper surface of the first barrier film 135a may also be recessed to the first depth d1 from the surface of the substrate 100, as in the case of the upper surface of the first filling film 120a. The first barrier film 135a may be formed to surround both sidewalls of the first filling film 120a.

The first barrier film 135a may be formed using a conductive material, e.g., a metal such as titanium nitride (TiN). The upper surface of the first filling film 120a and the upper surface of the first barrier film 135a may be on a same plane.

Figure 13:
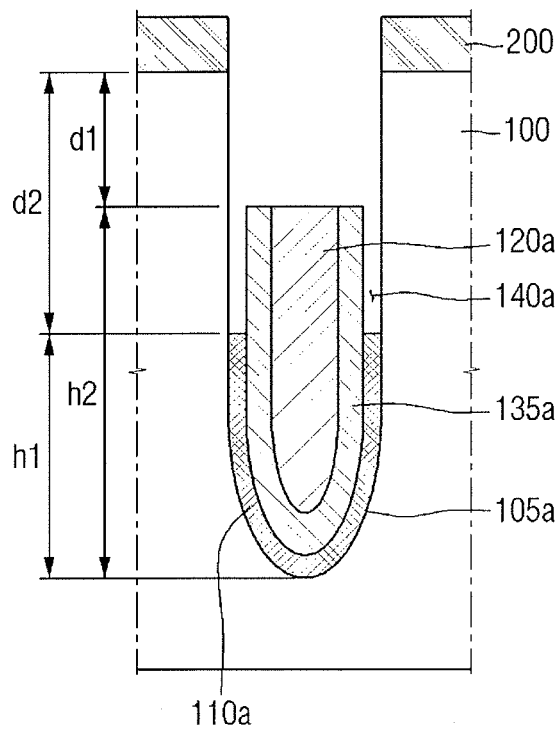

Next, referring to FIG. 13, an upper portion of the first gate insulating film 110a (e.g., distal to the bottom of the trench) may be selectively recessed so as to expose a sidewall of an upper portion of the first gate electrode 120a, 135a. The upper surface of the first gate insulating film 110a may be recessed by or to the second depth d2 from the surface of the substrate 100. The second depth d2 may be deeper or greater than the first depth d1. For example, a height of the first gate insulating film 110a (e.g., from the bottom of the trench) may be the first height h1, and a height of the first gate electrode 120a, 135a may be the second height h2, which may be higher than the first height h1.

The upper portion of the first gate insulating film 110a may be selectively removed using, e.g., a chemical oxide removal (COR) process. In an implementation, the COR process may be the dry etching.

In an implementation, the removal process of the first gate insulating film 110a may use wet etching. For example, the upper portion of the first gate insulating film 110a may only be selectively etched by using etching solution having a different etch selectivity with respect to the first gate electrode 120a, 135a and the first gate insulating film 110a, respectively.

In an implementation, the removal process of the first gate insulating film 110a may include a plurality of cycles. Accordingly, a degree of performing the removal may be adjusted based on the reasons described above with reference to FIGS. 8 and 9. For example, according to reduction of GIDL phenomenon and resistance of the gate insulating film, the first gate insulating film 110a may be etched to a proper or desired degree.

Figure 14:
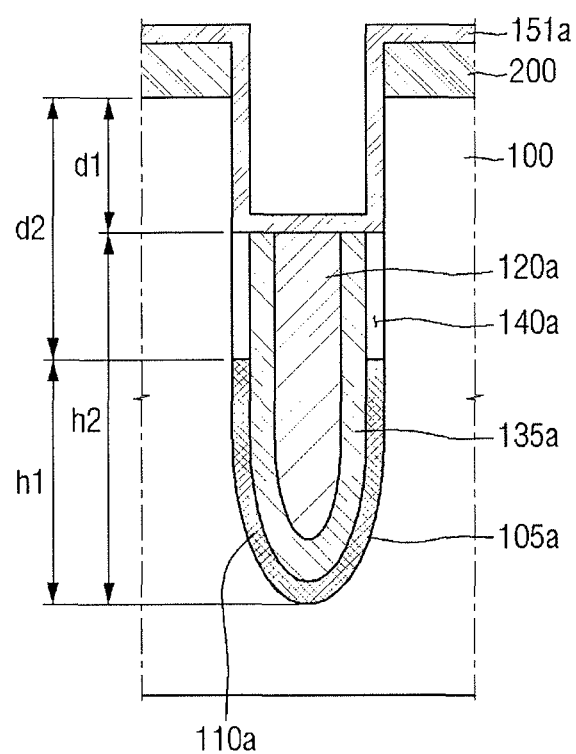

Next, referring to FIG. 14, the first line capping film 151a may be formed.

The first line capping film 151a may be conformally formed along the upper surfaces of the first gate electrode 120a, 135a, the upper surface and the side surface of the mask pattern 200, and a side surface of the first trench 105a. The first line capping film 151a may be formed with a method having poor step coverage. For example, the first line capping film 151a may be formed by a chemical vapor deposition (CVD) method. By doing so, the first air gap 140a may remain on the first gate insulating film 110a at a portion at which the first gate insulating film 110a was removed.

The first air gap 140a may be positioned between the first height h1 and the second height h2 from the bottom surface of the first trench 105a. The first air gap 140a may be positioned between the first gate electrode 120a, 135a and the sidewall of the first trench 105a.

The lower surface or end of the first air gap 140a may be in contact with or exposed to the first gate insulating film 110a. Conversely, the upper surface or end of the first air gap 140a may be in contact with or exposed to the first line capping film 150a. For example, the first air gap 140a may be formed according to a deposition method having height difference between the first gate electrode 120a, 135a and the first gate insulating film 110a, and the poor step coverage of the first line capping film 150a.

Figure 15:
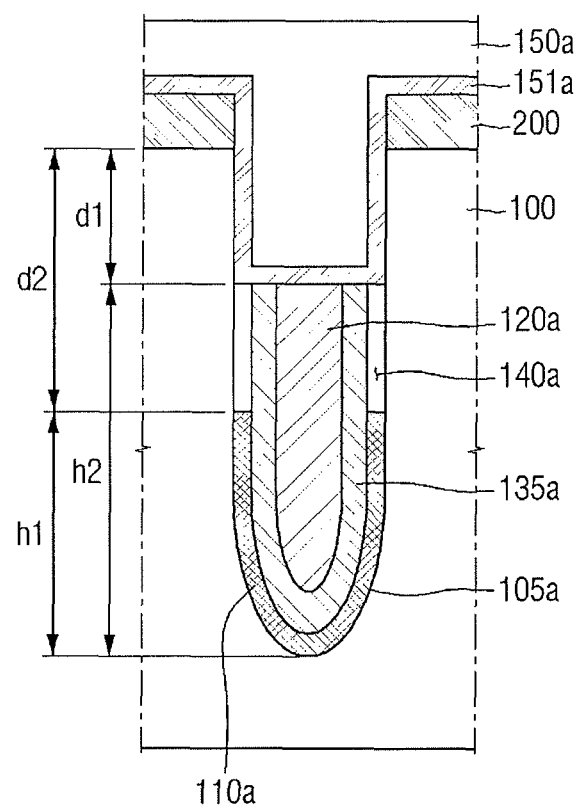

Next, referring to FIG. 15, the first filling capping film 150a is formed.

The first filling capping film 150a may be formed on the first line capping film 151a. The first filling capping film 150a may be surrounded with or by the first line capping film 151a. For example, the first filling capping film 150a may entirely fill the (e.g., remaining portions of the) first trench 105a, and thus all of the bottom surface and the side surface of the first filling capping film 150a may be in contact with the first line capping film 151a.

In an implementation, the first filling capping film 150a may be formed by, e.g., a chemical vapor deposition (CVD) method or an atomic layer deposition (ALD) method.

The first filling capping film 150a and the first line capping film 151a of FIGS. 14 and 15 may include a same material. In an implementation, the first filling capping film 150a and the first line capping film 151a may be seen as a single-layered film, which are not distinguished from each other.

In an implementation, the first filling capping film 150a and the first line capping film 151a may include, e.g., silicon nitride, silicon oxide, or silicon oxynitride.

In an implementation, the first filling capping film 150a and the first line capping film 151a may include different materials from each other. For example, the first filling capping film 150a and the first line capping film 151a may respectively be silicon nitride and silicon oxide.

In an implementation, as illustrated in the embodiment of FIG. 6, the native oxide film 153a may be further included between the first filling capping film 150a and the first line capping film 151a.

Figure 16:
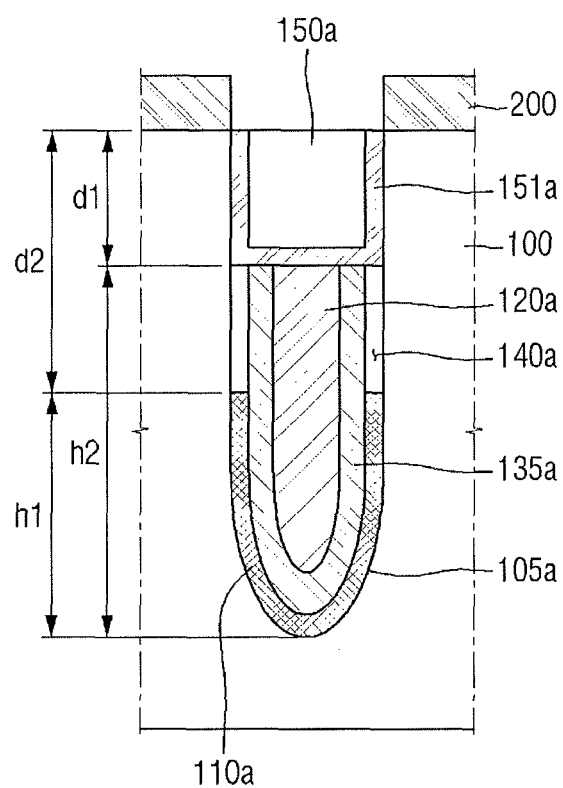

Next, referring to FIG. 16, a portion of the first capping film 150a, 151a may be removed.

The first capping film 150a, 151a, i.e., the first line capping film 151a and the first filling capping film 150a may be etched back, so that the upper surface of the substrate 100 and the upper surfaces of the first capping films 150a, 151a may have a same plane (e.g., may be coplanar). For example, extraneous portions of the first capping films 150a, 151a, on the side surface and the upper surface of the mask pattern 200, may be removed.

In an implementation, the first capping films 150a, 151a and the mask pattern 200 may be simultaneously removed through the planarization process.

Figure 17:
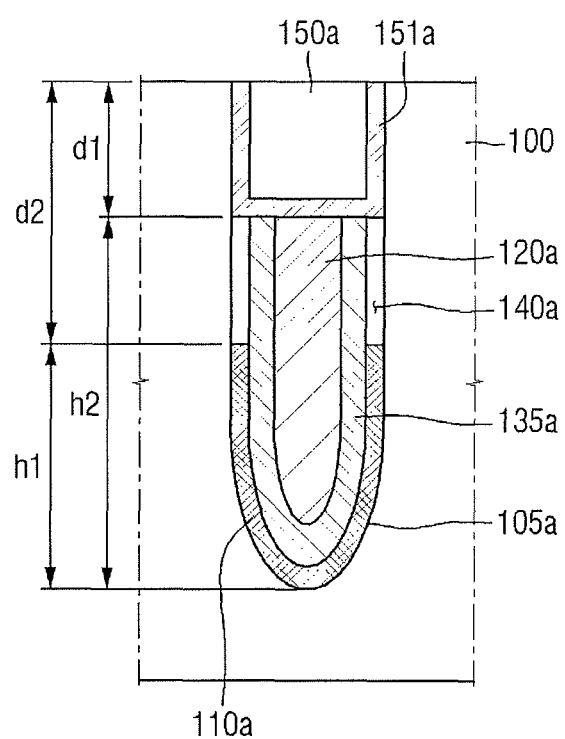

Next, referring to FIG. 17, the mask pattern 200 may be removed.

As the mask pattern 200 is removed, the upper surface of the substrate 100, in which the first trench 105a is not formed, may be exposed. Such upper surface of the substrate 100 may form a same plane as the upper surfaces of the first capping films 150a, 151a (e.g., may be coplanar with the upper surface of the capping films). Note that the concept "same" as used herein includes the possibility of having a fine stepped portion that may be caused due to process reason.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

By way of summation and review, the ultra large scale integration of DRAM device has continuously reduced the quantity of charge charged in the capacitor. Accordingly, efforts may be made to increase the quantity of charge stored in the capacitor, while also providing leakage current control to enhance driving of the device and performance thereof.

One of the reasons of the leakage current in DRAM cell may be leakage current in a gate off state between a gate called 'gate induced drain leakage (GIDL)' and a highly-doped BC node.

The embodiments may provide a semiconductor device with improved operating characteristic.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
  a substrate;
  a trench formed within a semiconductor layer of the substrate;
  a gate insulating film formed conformally along a portion of a surface of the trench;
  a gate electrode formed on the gate insulating film and filling a portion of the trench, the gate electrode including a filling film and a barrier film surrounding a lower surface and a side surface of the filling film;
  a capping film formed on the gate electrode and filling the trench; and
  an air gap formed between, the capping film and the gate insulating film and between the substrate and the gate electrode,
  wherein an upper surface of the filling film is coplanar with an upper surface of the barrier film, and
  wherein a height of an upper surface of the gate insulating film is lower than that of an upper surface of the gate electrode.

2. The semiconductor device as claimed in claim 1, wherein the capping film includes a first capping film formed conformally on a sidewall of the trench and the gate electrode, and a second capping film entirely filling an upper portion of the trench on the first capping film.

3. The semiconductor device as claimed in claim 2, wherein the second capping film includes SiN, and the first capping film includes silicon oxide or silicon nitride.

4. The semiconductor device as claimed in claim 2, wherein the capping film includes a native oxide film forming between the first capping film and the second capping film.

5. The semiconductor device as claimed in claim 1, wherein the air gap is in contact with a sidewall of the trench and the gate electrode.

6. The semiconductor device as claimed in claim 1, wherein an upper surface of the gate electrode and an upper surface of the air gap form a same plane.

7. The semiconductor device as claimed in claim 1, wherein the barrier film includes at least one of TiN and WN, and the filling film includes tungsten.

8. The semiconductor device as claimed in claim 1, wherein the air gap is between an upper portion of the barrier film and a sidewall of the trench.

9. A semiconductor device, comprising:
  a trench formed within a semiconductor layer of a substrate;
  a gate insulating film formed conformally along a portion of a sidewall of the trench, wherein a height of an upper surface of the gate insulating film is a first height;
  a gate electrode formed on the gate insulating film, the gate electrode including a filling film and a barrier film surrounding a lower surface and a side surface of the filling film, wherein a height of an upper surface of the gate electrode is a second height higher than the first height;

a capping film formed on the gate electrode and entirely filling the trench; and an air gap formed under the capping film, between the gate electrode and a sidewall of the trench and between the first height and the second height, wherein an upper surface of the filling film is coplanar with an upper surface of the barrier film.

10. The semiconductor device as claimed in claim 9, wherein:

the substrate includes a device isolation film and an active region isolated with the device isolation film, and the device isolation film and an upper surface of the capping film are on a same plane.

11. The semiconductor device as claimed in claim 10, wherein:

the gate electrode extends in a first direction, and the active region extends in a second direction at an acute angle with the first direction.

12. The semiconductor device as claimed in claim 11, further comprising a bit line intersecting with the first direction and extending in a third direction at an acute angle with the second direction.

13. The semiconductor device as claimed in claim 12, further comprising:

a source/drain within the substrate and on a side surface of the trench; and a bit line contact connecting the source/drain and the bit line.

14. The semiconductor device as claimed in claim 9, further comprising a source/drain within the substrate and on a side surface of the trench, wherein a lower surface of the source/drain and a lower surface of the air gap are a same plane.

15. A semiconductor device, comprising:

a substrate;

a trench in a semiconductor layer of the substrate;

a gate insulating film conformally formed along a bottom portion of the trench;

a gate electrode on the gate insulating film, the gate electrode including a filling film and a barrier film surrounding a lower surface and a side surface of the filling film;

a capping film on the gate electrode, the capping film extending from the gate electrode to an opening of the trench; and an air gap defined by the capping film, the gate insulating film, the gate electrode, and a sidewall of the trench, wherein a surface of the filling film that is distal to the bottom of the trench is coplanar with a surface of the barrier film that is distal to the bottom of the trench, and wherein a height of a surface of the gate insulating film that is distal to the bottom of the trench is lower than a height of a surface of the gate electrode that is distal to the bottom of the trench.

16. The semiconductor device as claimed in claim 15, wherein a distance from the bottom of the trench to a surface of the gate insulating film that is distal to the bottom of the trench is smaller than a distance from the bottom of the trench to a surface of the gate electrode that is distal to the bottom of the trench.

17. The semiconductor device as claimed in claim 15, wherein a surface of the gate electrode that is distal to the bottom of the trench is coplanar with a surface of the capping film that is proximate to the bottom of the trench, the surface of the capping film that is proximate to the bottom of the trench defining one side of the air gap.

18. The semiconductor device as claimed in claim 15, further comprising a source/drain within the substrate and at a side of the trench, wherein boundary of the source/drain is coplanar with an end of the air gap that is proximate to the bottom of the trench.

19. The semiconductor device as claimed in claim 15, further comprising a source/drain within the substrate and at a side of the trench, wherein the boundary of the source/drain is on a different plane relative to an end of the air gap that is proximate to the bottom of the trench.

* * * * *